US009183805B2

(12) United States Patent
Imai et al.

(10) Patent No.: US 9,183,805 B2
(45) Date of Patent: Nov. 10, 2015

(54) DISPLAY DRIVER CIRCUIT AND BOARD MODULE INCLUDING SAME

(75) Inventors: Masahiro Imai, Osaka (JP); Noriyuki Nakane, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 834 days.

(21) Appl. No.: 13/264,081

(22) PCT Filed: May 12, 2010

(86) PCT No.: PCT/JP2010/057998
§ 371 (c)(1), (2), (4) Date: Oct. 12, 2011

(87) PCT Pub. No.: WO2010/143489
PCT Pub. Date: Dec. 16, 2010

(65) Prior Publication Data
US 2012/0026138 A1 Feb. 2, 2012

(30) Foreign Application Priority Data
Jun. 10, 2009 (JP) ................................ 2009-138923

(51) Int. Cl.
*G09G 3/36* (2006.01)
*G09G 3/20* (2006.01)
*G02F 1/1345* (2006.01)
*H05K 1/14* (2006.01)

(52) U.S. Cl.
CPC ............ *G09G 3/3685* (2013.01); *G09G 3/2096* (2013.01); *G02F 1/13452* (2013.01); *G02F 1/13454* (2013.01); *G09G 2300/0426* (2013.01); *G09G 2330/06* (2013.01); *G09G 2370/08* (2013.01); *H05K 1/148* (2013.01); *H05K 2201/10136* (2013.01)

(58) Field of Classification Search
CPC .................................................. G02F 1/13454
USPC ........................................................ 349/149
See application file for complete search history.

(56) References Cited

U.S. PATENT DOCUMENTS

2006/0076656 A1* 4/2006 Onodera et al. .............. 257/668
2006/0192737 A1* 8/2006 Goto et al. ...................... 345/87
2006/0267925 A1 11/2006 Sakamaki et al.
2007/0038782 A1* 2/2007 Jones ........................... 709/250

(Continued)

FOREIGN PATENT DOCUMENTS

JP 1-79137 5/1989
JP 2005242017 A 9/2005

(Continued)

*Primary Examiner* — Edward Glick
*Assistant Examiner* — Alexander Gross
(74) *Attorney, Agent, or Firm* — Harness, Dickey & Pierce, P.L.C.

(57) ABSTRACT

In the case where input terminals of a display driver circuit are compatible with two or more types of interface specifications, an LSI chip, which is the display driver circuit, has some input terminals connected to parallel data lines and its output terminals connected to display lines, and these input terminals and output terminals are arranged along a long side located on the display portion side. In at least one example embodiment, the rest of the input terminals, which are intended for parallel interface, are arranged along a long side located on the FPC board side. With this configuration, the long sides of the LSI chip can be rendered shorter (than in the case where all input terminals are arranged in a row) without causing malfunction.

8 Claims, 4 Drawing Sheets

123
173a
141a
140
141b
173b

(56) References Cited

U.S. PATENT DOCUMENTS

2007/0138654 A1* 6/2007 Kim .............................. 257/786
2008/0290377 A1* 11/2008 Chang ........................... 257/208

FOREIGN PATENT DOCUMENTS

JP 2006330551 A 12/2006
JP 2010122483 A 6/2010

* cited by examiner

DISPLAY DRIVER CIRCUIT AND BOARD MODULE INCLUDING SAME

TECHNICAL FIELD

The present invention relates to display driver circuits and board modules including the same, and more specifically, the invention relates to a display driver circuit with two or more types of input interface terminals and a board module including the same.

BACKGROUND ART

Conventionally, display driver circuits for driving display portions such as liquid crystal display devices are mounted on, for example, glass substrates in the form of, for example, chips, and they receive video signals externally provided via flexible printed circuit (hereinafter, referred to as "FPC") boards connected to the glass substrates, and display video on the display portions.

The interface specifications used in methods for transmitting the video signals externally provided via the FPC boards are roughly divided into two types, i.e., serial and parallel modes. Usually, either of these is employed but both of them may be used together. For example, some discrete devices, such as cell phones and hand-held computers, include two or more display portions and a corresponding number of display driver circuits.

In such a configuration, typically, video signals are transmitted in the parallel mode to a circuit for driving a display portion closer to a main board that generated the video signals, and in the serial mode to a circuit for driving a display portion farther from the main board. It is conceivable that in such a device, different display driver circuits, each corresponding to only one of the interface specifications, are used for each of the circuits for driving the display portions, but this results in an increased number of parts and hence increased device production cost.

Therefore, by using display driver circuits each being provided with input terminals compatible with the two types of interface specifications, it is rendered possible to use driver circuits of the same configuration (i.e., of the same type) for any display portions, which results in reduced production cost.

Furthermore, for two display devices using two different interface specifications, by using such display driver circuits each being provided with input terminals compatible with the two types of interface specifications, it is rendered possible to commonly use driver circuits of the same configuration for both of the display devices, which results in reduced production cost as well.

Note that Japanese Laid-Open Utility Model Publication No. 1-79137 discloses a configuration of a graphic display device compatible with both the parallel and the serial interface specification.

CITATION LIST

Patent Document

[Patent Document 1] Japanese Laid-Open Utility Model Publication No. 1-79137

SUMMARY OF THE INVENTION

Problems to be Solved by the Invention

However, display driver circuits each provided with input terminals compatible with two interface specifications have more input terminals than are required for compatibility with only one of them, and therefore the display driver circuits have their peripheries increased where the input terminals are arranged, in particular, their long sides are lengthened.

For example, the display driver circuits as mentioned above are arranged in the vicinity of the display portions, and in general, they have display output terminals provided along their long sides close to the display portions and input terminals provided along the opposite long sides (i.e., their long sides close to the FPC boards). Accordingly, when a (total output terminal) length obtained by multiplying the total number of output terminals by a distance (pitch) between the terminals is shorter than a (total input terminal) length obtained by multiplying the total number of input terminals by a distance (pitch) between the terminals, the long sides of the display driver circuits become longer as the number of input terminals increases.

When the circuit size (particularly, the length of the long sides) increases as described above, it might become difficult to provide the circuits on glass substrates with limited areas for arrangement. Also, in the case where chips including such circuits are produced from a single wafer, the number of chips that can be produced from the single wafer decreases as the chip size increases, resulting in increased production cost of the display driver circuits.

Therefore, an objective of the present invention is to provide a display driver circuit and a board module including the same, in which input terminals are provided corresponding to two or more interface specifications and the long sides of the display driver circuit are shorter (than in the case where all input terminals are arranged in a row).

Solution to the Problems

A first aspect of the present invention is directed to a display driver circuit having a rectangular shape with long and short sides and being intended to be provided on a transparent substrate including a display portion for displaying images, the circuit comprising:

a first input terminal group for receiving first signals based on a first interface specification;

a second input terminal group for receiving second signals based on a second interface specification using signals which are lower in amplitude or higher in frequency than in the first interface specification; and an output terminal group for providing the display portion with display signals for displaying the images, the display signals being generated based on at least one of the first and second signals, wherein, the output terminal group and at least a part of the first input terminal group are arranged along one of the long sides, and the second input terminal group is arranged along the other long side.

In a second aspect of the present invention, based on the first aspect of the invention, the first signals include parallel data signals and parallel clock signals based on a parallel interface specification, and the second signals include serial data signals and serial clock signals based on a serial interface specification.

In a third aspect of the present invention, based on the second aspect of the invention, the first input terminal group arranged along one of the long sides includes parallel input terminals for receiving at least a part of the parallel data signals and the parallel clock signals.

In a fourth aspect of the present invention, based on the third aspect of the invention, the parallel input terminals are arranged in the vicinity of the short side.

In a fifth aspect of the present invention, based on the second aspect of the invention, the parallel input terminals included in the first input terminal group and intended to receive at least a part of the parallel data signals and the parallel clock signals are arranged along the short side.

In a sixth aspect of the present invention, based on the second aspect of the invention, the second input terminal group arranged along the other long side includes input terminals for receiving the serial data signals and the serial clock signals.

A seventh aspect of the present invention is directed to a board module, the module comprising:

a display driver circuit of the first aspect of the invention with its display portion;

a transparent substrate;

display lines formed on the transparent substrate and intended to transmit the display signals from the output terminal group to the display portion; and input lines formed on the transparent substrate and intended to transmit at least one of the first and second signals to be externally provided to at least one of the first and second input terminal groups, and the display driver circuit is arranged such that the display portion is adjacent to the long side along which the output terminal group is arranged.

In an eighth aspect of the present invention, based on the seventh aspect of the invention, the first signals include parallel data signals and parallel clock signals based on a parallel interface specification, the second signals include serial data signals and serial clock signals based on a serial interface specification, and the first input terminal group arranged along the long side includes parallel input terminals for receiving at least a part of the parallel data signals and the parallel clock signals.

In a ninth aspect of the present invention, based on the eighth aspect of the invention, the display driver circuit is mounted on the transparent substrate as a circuit chip, the parallel input terminals are arranged in the vicinity of the short side, and input lines connected to the parallel input terminals are arranged so as to pass the short side from below the circuit chip.

In a tenth aspect of the present invention, based on the eighth aspect of the invention, input lines connected to the parallel input terminals have a width greater than those of input lines connected to the second input terminal group arranged along the other long side.

Effect of the Invention

According to the first aspect of the present invention, since the output terminal group and at least a part of the first input terminal group are arranged along one of the long sides of the display driver circuit, and the second input terminal group is arranged along the other long side, the long sides can be rendered shorter (than in the case where all input terminals are arranged in a row), resulting in reduced production cost.

According to the second aspect of the present invention, the first and second input terminal groups for receiving signals based on the parallel interface specification and the serial interface specification are appropriately arranged, thereby making it possible to shorten the long sides, resulting in reduced production cost.

According to the third aspect of the present invention, the parallel input terminals for receiving at least a part of the parallel data signals and the parallel clock signals, which typically have relatively high amplitudes and relatively low frequencies and therefore can be transmitted even if line impedance is high, are arranged along one of the long sides, thereby making it possible to shorten the long sides, resulting in reduced production cost. Note that power lines and grounding lines for the parallel interface specification are normally required to have low line impedance, and therefore, preferably, they are not included in the parallel input terminals and not arranged along the aforementioned long side.

According to the fourth aspect of the present invention, since the parallel input terminals are arranged in the vicinity of the short side, it is possible to provide lines so as to pass, for example, immediately below the short side or in the vicinity of the short side, without being interfered by the output terminal group arranged along the same long side as the parallel input terminals, resulting in a reduced wiring distance from the parallel input terminals, hence reduced line impedance.

According to the fifth aspect of the present invention, since the parallel input terminals are arranged along the short side, it is possible to shorten the long sides, resulting in reduced production cost. In addition, it is possible to reduce the wiring distance from the parallel input terminal more than when they are arranged along the long side where the output terminal group is arranged, resulting in reduced line impedance.

According to the sixth aspect of the present invention, since the input terminals for receiving the serial data signals and the serial clock signals are arranged along a different long side from the output terminal group, it is rendered possible to shorten input lines from, for example, an FPC board or suchlike, resulting in reduced line impedance.

According to the seventh aspect of the present invention, it is possible to provide, for example, a board module (for display), such as a liquid crystal module, which includes a display driver circuit capable of achieving the same effect as that achieved by the first aspect of the invention.

According to the eighth aspect of the present invention, it is possible to provide, for example, a board module (for display), such as a liquid crystal module, which includes a display driver circuit capable of achieving the same effect as that achieved by the third aspect of the invention.

According to the ninth aspect of the present invention, since the input lines which are connected to the parallel input terminals arranged in the vicinity of the short side are arranged so as to pass the short side from below the circuit chip, it is possible to reduce their wiring distances, resulting in reduced line impedance.

According to the tenth aspect of the present invention, since the input lines connected to the parallel input terminals have a width greater than those of input lines connected to the second input terminal group, it is possible to reduce their line impedance despite increased wiring distances.

MODE(S) FOR CARRYING OUT THE INVENTION

<1. Configuration of the Liquid Crystal Display Device>

Figure 1:
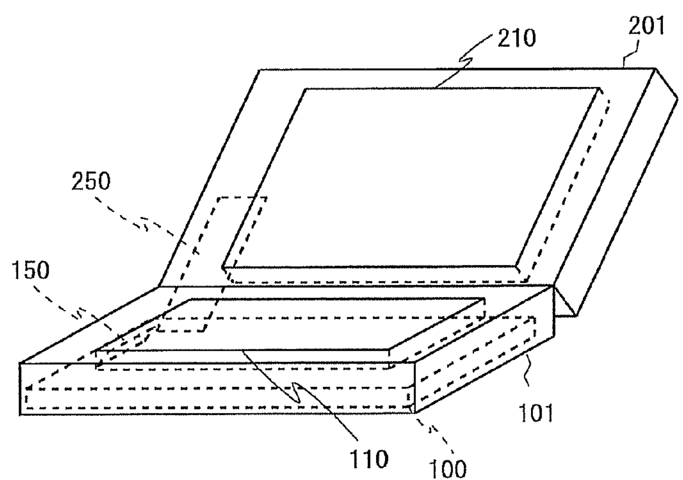
FIG. 1 is a perspective view schematically illustrating the configuration of a liquid crystal display device according to an embodiment of the present invention.
Figure 2:
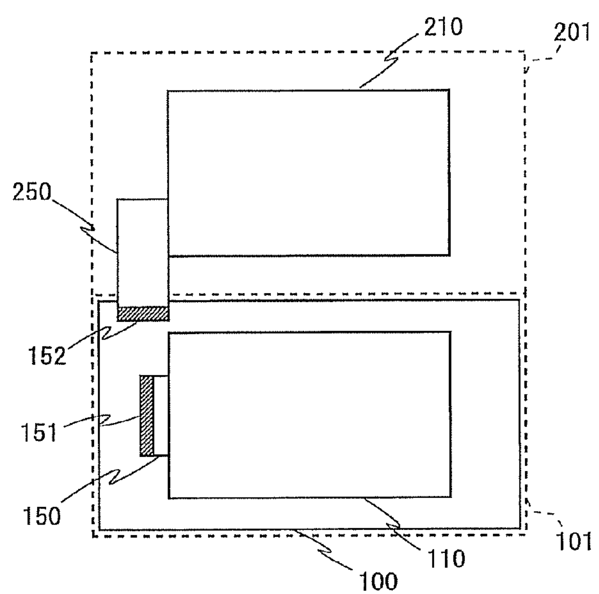
FIG. 2 is a view schematically illustrating the configuration of the liquid crystal display device shown in FIG. 1 in the embodiment.

FIG. 1 is a perspective view schematically illustrating the configuration of a liquid crystal display device according to an embodiment of the present invention, and FIG. 2 is a schematic plan view illustrating the same configuration. As shown in FIG. 1, the liquid crystal display device is a hand-held information terminal device, such as a PDA (personal digital assistant) or a cell phone terminal, which includes a first liquid crystal module 110, a main board 100, and a first housing 101 for accommodating them, and also includes a second liquid crystal module 210, and a second housing 201 for accommodation thereof. Moreover, the first liquid crystal module 110 and the main board 100 are connected by a first FPC board 150, and the second liquid crystal module 210 and the main board 100 are connected by a second FPC board 250. Note that for the sake of clarification, the positions, sizes, shapes, etc., of these elements are shown as different from those of the actual elements.

In this manner, the hand-held information terminal device, which is a liquid crystal display device, has two screens for display by the first and second liquid crystal modules 110 and 210. Note that the configuration of the present embodiment can be applied without modification to any display devices with two or more screens. Furthermore, it can be applied to any display devices with one screen as well, and details thereof will be described later in conjunction with a variant.

Here, as shown in FIG. 2, the second FPC board 250 is connected to a serial interface connector 152 provided on the main board 100, and the first FPC board 150 is connected to a parallel interface connector 151 provided on the main board 100.

As will be described later, since the number of signal lines required for the serial interface (including lines for power supply, etc.) is less than the number of signal lines for the parallel interface (including lines for power supply, etc.), and signal transmission via the serial interface is effective in reducing electro-magnetic interference (EMI), the second FPC board 250, whose transmission distance is long, in some cases performs signal transmission via the serial interface. However, signal transmission via the serial interface increases power consumption, and therefore the first FPC board 150, whose transmission distance is long, in some cases performs signal transmission via the parallel interface. Note that the reasons as stated above for employing these interface specifications are illustrative, and the interface specifications are appropriately used for various reasons.

In the case where two interface specifications are employed as above, it is conceivable that the first liquid crystal module 110 and the second liquid crystal module 210 use different display driver circuits each being compatible with only one of the interface specifications, but the number of parts increases, which results in increased device production cost. Accordingly, by using a display driver circuit provided with input terminals which are respectively compatible with the two interface specifications, it is rendered possible to use identical display driver circuits for any liquid crystal display modules, resulting in reduced production cost. Therefore, in the present embodiment, LSI chips including identical display driver circuits are used in the first liquid crystal module 110 and the second liquid crystal module 210. Hereinafter, referring to FIGS. 3 and 4, the configurations of these liquid crystal modules will be described.

<2. Configurations of the Liquid Crystal Modules>

Figure 3:
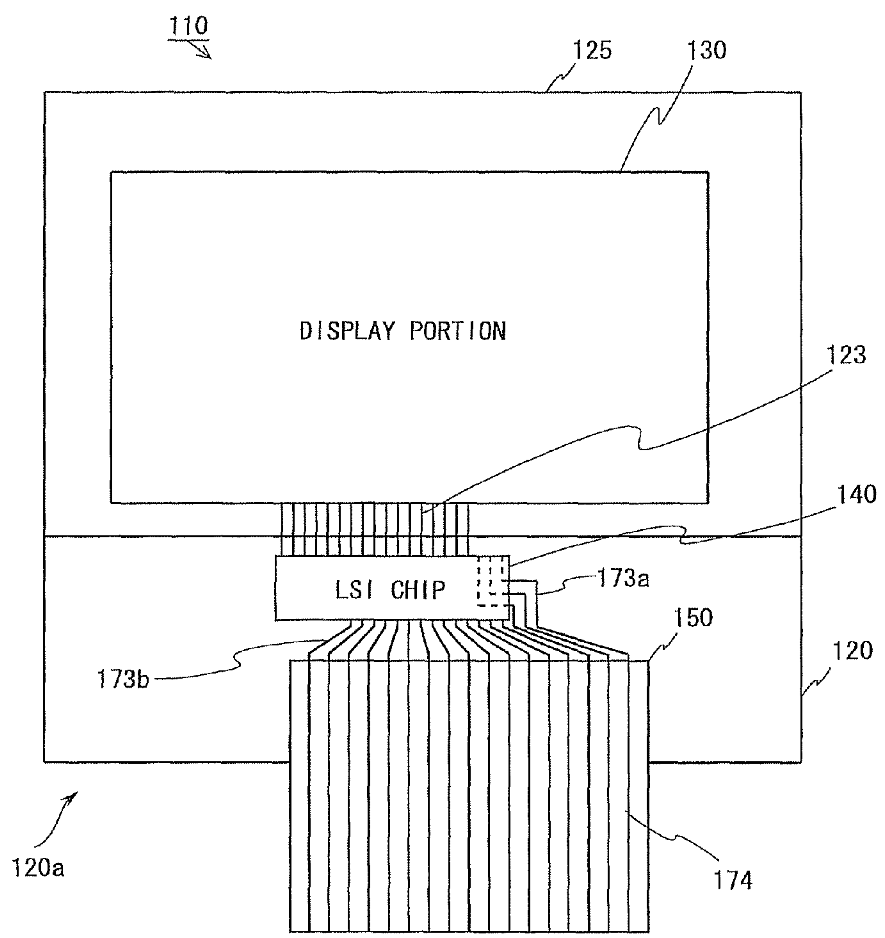
FIG. 3 is a schematic plan view illustrating the configuration of a first liquid crystal module in the embodiment.
Figure 4:
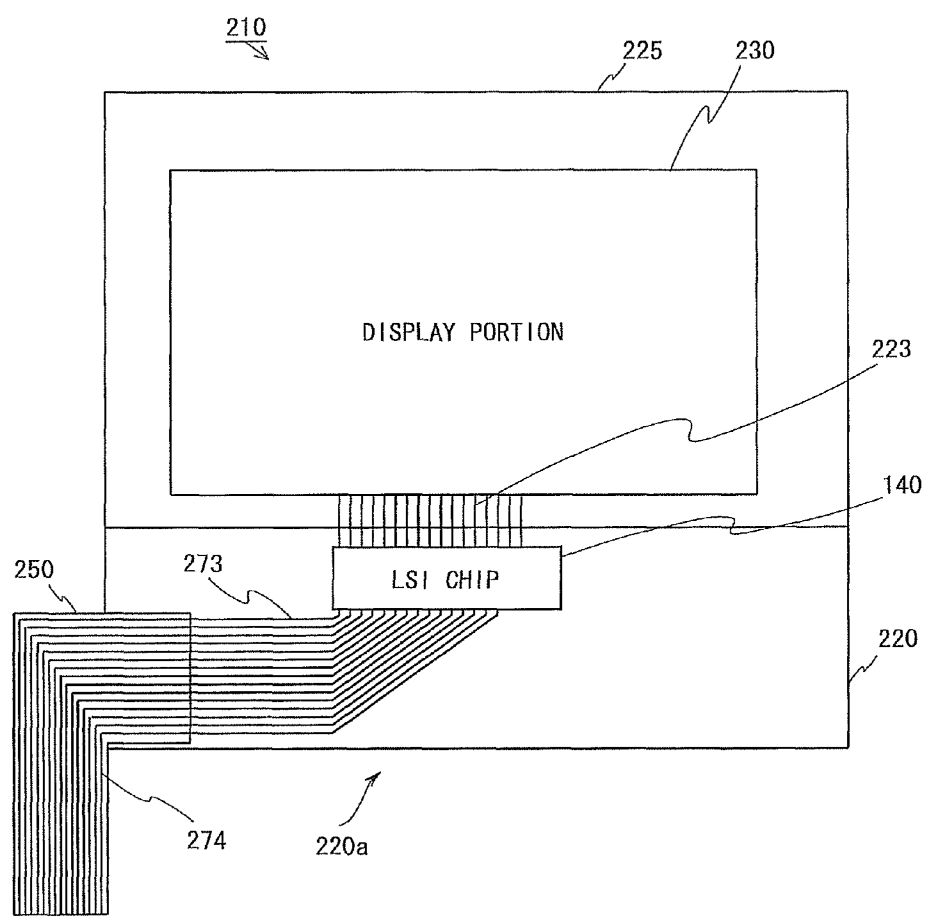
FIG. 4 is a schematic plan view illustrating the configuration of a second liquid crystal module in the embodiment.

FIG. 3 is a schematic plan view illustrating the configuration of the first liquid crystal module 110 according to the embodiment of the present invention, and FIG. 4 is a schematic plan view illustrating the configuration of the second liquid crystal module 210 according to the embodiment of the present invention. Note that for the sake of clarification, the positions, sizes, shapes, etc., of elements in the figures are shown as different from those of the actual elements.

The first liquid crystal module 110 includes two opposingly arranged glass substrates 120 and 125, and an LSI chip 140 for display drive, as shown in FIG. 3. Note that electronic components such as capacitors may further be included. Similarly, the second liquid crystal module 210 includes two opposingly arranged glass substrates 220 and 225 and an LSI chip 140 for display drive, which is configured in the same manner as that included in the first liquid crystal module 110, as shown in FIG. 4.

In a space between the two glass substrates 120 and 125 included in the first liquid crystal module 110, a display portion 130 is formed with a liquid crystal (not shown) enclosed with a seal material (not shown). The glass substrate 120 includes a projection **120*a*, which has mounted thereon the LSI chip 140 having a driver function required for driving the liquid crystal and the first FPC board 150 connected to the outside. When a video signal to be transmitted via the parallel interface is provided from main board 100 to the LSI chip 140 via the first FPC board 150, the LSI chip 140 displays video by providing a display signal to the display portion 130**.

Similarly, in a space between the glass substrates 220 and 225 of the second liquid crystal module 210, a display portion 230 is formed with a liquid crystal enclosed therein, and the glass substrate 220 has a projection **220*a* on which the LSI chip 140 and the second FPC board 250 are mounted. When a video signal to be transmitted via the serial interface is provided from the main board to the LSI chip 140 via the second FPC board 250, the LSI chip 140 displays video by providing a display signal to the display portion 230**.

The LSI chips 140 are bare chips (unpackaged chips) each having circuit patterns, including a gate driver, a source driver and a DC/DC converter, formed on the surface of a silicon substrate using micromachining technology and also having formed thereon bump electrodes which function as connecting terminals for connecting the circuit patterns to the outside. For example, the bump electrodes are about 15 μm high. Note that the configurations with the LSI chips 140, which are bare chips, being bonded face-down to the projections **120*a* are illustrative, and, for example, LSI devices with the LSI chips 140 packed in surface-mount packages may be mounted on the glass substrate 120**.

The first and second FPC boards 150 and 250 are, for example, freely bendable boards each having a plurality of 8 to 50 μm-thick copper foil wiring layers 174, 274 formed on one side of a 12 to 50 μm-thick flexible insulating film 51. Note that the wiring layers 174, 274, may be formed on both sides of the insulating film, rather than only on one side.

As shown in FIG. 3, the LSI chip 140 included in the first liquid crystal module 110 is connected to one end of each FPC line 173 formed on the projection **120*a* and display lines 123 which extend toward the display portion 130. Furthermore, the wiring layers 174 of the first FPC board 150 are connected to the other ends of the FPC lines 173. In this manner, the wiring layers 174 of the first FPC board 150 and the input terminals of the LSI chip 140** are connected via the FPC lines

173, and therefore signals, including video signals and clock signals, reference voltage, etc., which are provided from the main board 100 to the wiring layers 174 of the first FPC board 150, are provided to their respective corresponding input terminals of the LSI chip 140. Note that for such connections, an anisotropic conductive film (ACF) is normally used to achieve thermocompression bonding. The above configuration also applies to lines provided in the second liquid crystal module 210, any descriptions of which therefore will be omitted. Next, the relation of connection between the terminals and the wiring of the LSI chip 140 will be described with reference to FIG. 5.

Figure 5:
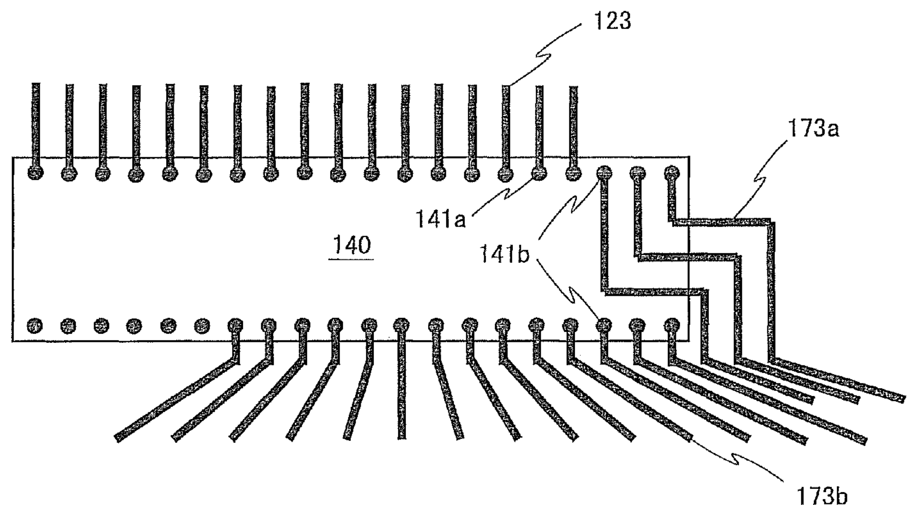
FIG. 5 is a plan view with an LSI chip and its surroundings in the embodiment being viewed from the backside of a glass substrate.

FIG. 5 is a plan view with the LSI chip 140 and its surroundings being viewed from the backside of the glass substrate 120. Note that the numbers of display lines 123 and FPC lines 173 and also the numbers of output terminals 141*a* and input terminals 141*b*, which are bump electrodes corresponding to the lines, are from tens to hundreds as will be described later, but they are schematically shown in the figure and the widths of the lines and the intervals therebetween are schematically shown as different from the actuality.

As shown in FIG. 5, the display lines 123 leading from the display portion 130 are connected to the output terminals 141*a*, and all of the output terminals 141*a* of the LSI chip 140 are arranged along a long side (of the LSI chip 140) that is located on the display portion 130 side. In addition, a part of the input terminals 141*b* is provided along the long side, and these input terminals 141*b*, which are therefore arranged side-by-side with the output terminals 141*a*, are connected to parallel data lines 173*a*, which constitute a part of the FPC lines 173. Furthermore, input terminals 141*b* are provided along a long side (of the LSI chip 140) that is located on the first FPC board 150 side (opposite to the display portion 130), and the input terminals 141*b* are connected to various lines 173*b*, which constitute a part of the FPC lines 173.

Here, the lines on the first and second FPC boards 150 and 250 are formed of copper foil (Cu) having a thickness of, for example, 8 μm or more, so that sheet resistance can be sufficiently low. On the other hand, copper is difficult to process by etching, and therefore is not used in the process of producing the first and second liquid crystal modules 110 and 210. Accordingly, tantalum (Ta) or aluminum (Al), which is used in the production process, is used to form various lines on the glass substrate.

However, in the case where tantalum or aluminum has a thickness of, for example, 0.2 to 0.4 μm, the sheet resistance of tantalum and aluminum is tens to hundreds times higher than the sheet resistance of copper. In addition, the lines on the glass substrate generally cannot be formed in multilayers as they can be on the FPC board. Accordingly, there are predetermined limits to the number and width of lines to be formed on the glass substrate. Therefore, in accordance with the limits, the numbers of output terminals 141*a* and input terminals 141*b* of the LSI chip 140 and the pitches therebetween are determined.

Here, specific examples are given below. The number of output terminals 141*a* of the LSI chip 140 is 480, which is the same as the number of data signal lines of the display portion 130, and the pitch between output terminals is 20 μm. Also, the number of input terminals 141*b* connected to the parallel data lines 173*a* is 24, the number of input terminals 141*b* connected to the various lines 173*b* is 162 (the breakdown of which will be described later), and the pitch between input terminals is 70 μm. The reason the pitch between output terminals is less than the pitch between input terminals as above is that less line impedance is required for the output terminals than for the input terminals.

However, the pitch between input terminals is determined to have a magnitude such that serial or parallel interface signals to be inputted do not take abnormal values (due to line impedance). Accordingly, the pitch is too short for power lines and grounding lines for which lower impedance is required in order to achieve stable circuit operation. Therefore, twenty input terminals 141*b* are grouped together here to be connected to the same serial or parallel interface power line or grounding line. As a result, the width of the serial or parallel interface power line or grounding line can be increased about twenty times, making it possible to reduce its line impedance sufficiently.

Furthermore, the input terminals 141*b* are also connected to power lines and grounding lines for driving the liquid crystal. To stably drive the liquid crystal, their line impedance needs to be particularly low. Therefore, thirty input terminals 141*b* are grouped together here to be connected to the same power line or grounding line for driving the liquid crystal. As a result, the line width can be increased about thirty times, making it possible to further reduce its line impedance efficiently.

Moreover, the input terminals 141*b* are connected to setting signal lines for controlling various operations of the LSI chip 140, including an operation to switch between parallel and serial interface. Here, the number of input terminals 141*b* to be connected is 13. Note that they may be omitted in whole or in part, and the switching between parallel and serial interface may be performed by transmitting a predetermined command.

In addition, here, two clock signal lines are used for serial interface, four data signal lines are used for serial interface, and twenty input terminals 141*b* are connected to each of the power lines and the grounding lines used for serial interface, as described above, which makes a total of forty-six (=2+4+20+20) input terminals 141*b* to be used for serial interface.

Furthermore, here, one clock signal line is used for parallel interface, twenty-four data signal lines are used for parallel interface, two synchronization signal lines are used for parallel interface, and twenty input terminals 141*b* are connected to each of the power lines and the grounding lines used for parallel interface, as described above, which makes a total of sixty-seven (=1+24+2+20+20) input terminals 141*b* to be used for parallel interface. Here, the data signal lines used for parallel interface are connected to twenty-four input terminals 141*b* arranged at the long side (of the LSI chip 140) that is located on the display portion 130 side. Also, the total number of input terminals 141*b* connected to the power lines and grounding lines for driving the liquid crystal and the setting signal lines is 73 (=30+30+13).

From above, the number of input terminals 141*b* here is 186 in total, including not only the input terminals 141*b* arranged at the long side of the LSI chip 140 that is located on the first FPC board 150 side but also twenty-four of them arranged at the long side located on the display portion 130 side. Thus, it is possible to shorten the long sides by 1680 μm (=24×70) compared to the conventional configuration in which all input terminals of the LSI chip are arranged on the FPC board side.

Note that the actual outside dimensions of the LSI chip 140 as a bare chip are, for example, 12000 μm long per long side and 1000 μm long per short side. Here, if some input terminals 141*b* are arranged at any of the short sides, the long sides can be further shortened, but usually if the short sides are lengthened, the number of circuits that can be produced per wafer decreases, resulting in increased production cost. Therefore, the length of the short sides is determined solely considering the circuit scale, and if input terminals are arranged along any short side, the number of terminals that can be arranged might be restricted.

Next, the reason the data signal lines used for parallel interface are connected to twenty-four input terminals 141*b* arranged along the long side (of the LSI chip 140) that is located on the display portion 130 side will be described with reference to FIG. 6.

Figure 6:
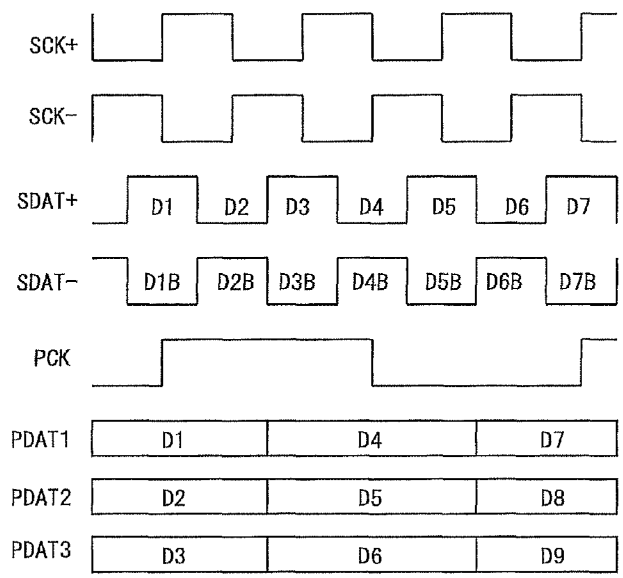
FIG. 6 is a diagram schematically illustrating waveforms of signals to be used for serial interface and signals to be used for parallel interface in the embodiment.

FIG. 6 is a diagram schematically illustrating waveforms of signals to be used for serial interface and signals to be used for parallel interface. In FIG. 6, serial clock signals SCK+ and SCK−, serial data signals SDAT+ and SDAT−, a parallel clock signal PCK, and parallel data signals $PDAT_1$ to $PDAT_3$ are shown.

Here, the serial clock signals refer to clock signals in a predetermined serial interface specification, and the serial data signals refer to data signals in that specification. Also, the parallel clock signal refers to a clock signal in a predetermined parallel interface specification, and the parallel data signals refer to data signals in that specification.

Note that in the foregoing description, the serial data signals are divided into four types and the parallel data signals are divided into twenty-four types, while in FIG. 6, for ease of explanation, an example is given where the two serial data signals SDAT+ and SDAT- and the three parallel data signals $PDAT_1$ to $PDAT_3$ are used. In addition, for each data item, sampling is carried out at opposite edges (upon rise and fall) of corresponding clock, but sampling may be carried out at only one of the edges.

As shown in FIG. 6, for the serial clock signals SCK+ and SCK− and the serial data signals SDAT+ and SDAT−, the signals in each pair are in the relationship of positive and negative differential signals, and here, the DC voltage level of these signals is 0.9V, which is half of a logic power voltage which is 1.8V. In addition, the amplitude is ±100 mV.

In this manner, the data signals and the clock signals to be used for serial interface have low amplitudes but are set at high frequencies. As a result, it is possible to suppress occurrence of EMI and achieve high-speed data transmission. However, this results in increased power consumption.

On the other hand, the parallel clock signal PCK and the parallel data signals $PDAT_1$ to $PDAT_3$ have as high amplitudes as the logic power voltage of 1.8V, as shown in FIG. 6, and they are set at low frequencies. As a result, it is possible to achieve data transmission with less power consumption. In addition, to ensure the amount of data required to be transmitted within a unit time, the number of signals required (here, 24) is greater than the number of signals to be used for serial interface (here, 4).

In this manner, data signals and clock signals to be used for serial interface have high frequencies and low amplitudes. Concretely, high frequencies result in shortened setup and hold times for the signals, leading to low noise immunity, and low amplitudes result in a narrow voltage range in which signal levels can be recognized, also leading to low noise immunity. Accordingly, in the case where an FPC board with an extremely low resistance is used, the signals can be transmitted a relatively long distance, but in the case where the signals are transmitted through lines on a glass substrate with a relatively high resistance, as described earlier, the lines are preferably as short as possible for the purpose of ensuring sufficient noise immunity.

Furthermore, as described earlier, power lines and grounding lines are required to have as low impedance as possible in order to achieve stable circuit operation. Therefore, in the case where power lines and grounding lines are connected via wiring on a glass substrate with a relatively high resistance, the lines are preferably as short as possible.

On the other hand, data signals and clock signals to be used for parallel interface have low frequencies and high amplitudes. Concretely, low frequencies result in prolonged setup and hold times for the signals, leading to high noise immunity, and high amplitudes result in a wide voltage range in which signal levels can be recognized, also leading to high noise immunity. Accordingly, in the case where an FPC board is used, and even in the case where lines on a glass substrate with a relatively high resistance are used, the signals can be transmitted a distance which is relatively long to such a degree that no malfunction occurs.

In this manner, the upper limit of the line impedance required for stable operations for serial interface is lower than the upper limit of the line impedance required for stable operations for parallel interface.

The present embodiment focuses on this fact, and twenty-four data signal lines to be used for parallel interface are respectively connected to twenty-four input terminals 141*b* arranged along the long side (of the LSI chip 140) that is located on the display portion 130 side, i.e., on the farside from the FPC board 150. As a result, no malfunction occurs due to noise or suchlike, and the long sides can be shortened (by 1680 μm) compared to the conventional configuration in which all input terminals of the LSI chip are arranged on the FPC board side. Note that clock signal lines to be used for parallel interface may be connected in whole or in part to the twenty-four input terminals 141*b*. Moreover, synchronization signal lines (and other signal lines excluding the power lines and the grounding lines) to be used for parallel interface may be connected in whole or in part.

Here, as shown in FIG. 5, the twenty-four input terminals 141*b* are connected to twenty-four data signal lines (in the wiring layers 174 included in the FPC board 150) via parallel data lines 173*a*. The parallel data lines 173*a* are arranged so as to pass immediately below a short side (on the right side of the figure) of the LSI chip 140. The parallel data lines 173*a* may be placed outside so as not to pass immediately below the LSI chip 140, but in such a case, the parallel data lines 173*a* are required to be longer. Consequently, the parallel data lines 173*a* have higher impedance, so that in some cases, malfunction might occur. Therefore, the lines that are connected to the twenty-four input terminals 141*b* arranged along the long side on the display portion 130 side (here, the parallel data lines 173*a*) are preferably arranged so as to extend outward from immediately below the LSI chip 140 by passing immediately below a short side of the LSI chip 140 that has no terminals. However, the number of terminals that extend outward from immediately below the chip's short side may be restricted depending on the chip's short-side length. In such a case, only a part of the terminals may pass immediately below the chip's short side and the rest of the terminals may be placed outside.

Furthermore, in this configuration, the twenty-four input terminals 141*b* are preferably arranged in the vicinity of a short side of the LSI chip 140. As a result, the parallel data lines 173*a* can be shortened, making it possible to reduce impedance and therefore reduce the possibility of malfunction. Note that even in the configuration with the parallel data lines 173*a* being placed outside so as not to pass immediately below the LSI chip 140, the twenty-four input terminals 141*b* are preferably arranged in the vicinity of a short side of the LSI chip 140, making it possible to shorten the parallel data lines 173*a*.

Moreover, the parallel data lines 173*a* connected to the twenty-four input terminals 141*b* are preferably formed to have a width greater than those of the various lines 173*b* included in other FPC lines 173. Also, to that end, the pitches between the twenty-four input terminals 141*b* are preferably longer (than 70 μm). With such a configuration, the impedance of the parallel data lines 173*a* can be rendered lower, making it possible to further reduce the possibility of malfunction.

<3. Effect>

As described above, among all input terminals of the LSI chip 140, a part of the input terminals for parallel interface (here, twenty-four input terminals for receiving parallel data signals) is arranged together with output terminals along the long side located on the display portion 130 side, and the rest of the input terminals for parallel interface are arranged along the long side located on the FPC board 150 side. With this configuration, the long sides of the LSI chip 140 functioning as a display driver circuit can be rendered shorter (than in the case where all the input terminals are arranged in a row), making it possible to reduce its production cost.

<4. Variant>

In the above embodiment, a part of the input terminals for parallel interface (here, twenty-four input terminals for receiving parallel data signals) is arranged along the long side located on the display portion 130 side, but a part of them (or other input terminals for receiving parallel interface signals, e.g., parallel clock signals PCK) may be arranged along a short side of the LSI chip 140. This configuration also allows the long sides of the LSI chip 140 functioning as a display driver circuit to be rendered shorter (than in the case where all input terminals are arranged in a row), making it possible to reduce its production cost.

In the above embodiment, two liquid crystal modules included in one hand-held information terminal device (liquid crystal display device) have identical LSI chips 140 packaged therein, but the number of included liquid crystal modules and the number of LSI chips 140 do not have much weight in application of the present invention, so long as the LSI chips 140 have serial interface input terminals and parallel interface input terminals. For example, where there are a liquid crystal display device solely using serial interface and a liquid crystal display device solely using parallel interface, if these devices use LSI chips 140 of the same configuration, their production cost can be reduced as in the above embodiment.

In the above embodiment, identical LSI chips 140 are mounted on glass substrates of liquid crystal modules, but instead, each chip may be provided in monolithic form with its display driver circuit being formed in an area of a glass substrate that is adjacent to a display portion using a thin film such as continuous grain silicon (CG silicon), amorphous silicon, or polycrystaline silicon. Such a configuration often results in a larger size due to process rules, but the first and second liquid crystal modules 110 and 210 before having their lines formed therein can be configured in the same manner if they can be formed in a usable size, also resulting in reduced production cost. Furthermore, in the above embodiment, tantalum (Ta) or aluminum (Al)) is used to form various lines on the glass substrate, but other well-known wiring materials can also be used. Moreover, in the above embodiment, various lines are formed on the glass substrate, but a transparent plastic substrate made of a well-known material may be used in place of the glass substrate, which is also a transparent substrate. In this case also, various wiring materials can be used, but ITO (indium tin oxide), which is transparent, is typically used.

While the above embodiment has been described with respect to the board modules which are liquid crystal modules, embodiments are not limited to liquid crystal modules to be used in liquid crystal display devices, and can also similarly be applied to board modules to be used in various display devices, including organic or inorganic EL (electro luminescence) displays, plasma display panels (PDP), vacuum fluorescent displays, and electronic paper, and various other board modules not for use in display devices.

While the present invention has been described in detail above, the foregoing is illustrative in all aspects and is not restrictive. Numerous other changes and modifications can be conceived without departing from the scope of the invention.

INDUSTRIAL APPLICABILITY

The present invention is applicable to display driver circuits and board modules, such as liquid crystal modules, which are provided with the same, and more specifically, for example, the invention is suitable for a display driver circuit and a board module including the same, in which the display driver circuit has two or more types of input interface terminals for use in hand-held information terminal devices.

DESCRIPTION OF THE REFERENCE CHARACTERS

100 main board
101 first housing
110 first liquid crystal module
120, 125, 220, 225 glass substrate
120*a*, 220*a* projection
123, 223 display line
130, 230 display portion
140 LSI chip
141*a* output terminal 141*b* input terminal
150, 250 FPC board
173, 273 FPC line
173*a* parallel data line
174, 274 FPC board's wiring layer
201 second housing
210 second liquid crystal module

The invention claimed is:

1. A display driver circuit having a rectangular shape with long sides and short sides, the circuit configured to mount to a transparent substrate including a display portion for displaying images, the display portion located relatively closer to a first one of the long sides of the circuit than a second one of the long sides of the circuit, the circuit comprising:

a first input terminal group for receiving first signals based on a first interface specification, the first signals including parallel data signals and parallel clock signals based on a parallel interface specification;

a second input terminal group for receiving second signals based on a second interface specification using signals which are lower in amplitude or higher in frequency than in the first interface specification such that each input terminal belongs to only one of the first input terminal group and the second input terminal group, the second signals including serial data signals and serial clock signals based on a serial interface specification; and an output terminal group for providing the display portion with display signals for displaying the images, the output terminal group including all output terminals of the display driver circuit, the display signals being generated based on at least one of the first and second signals, wherein, the output terminal group and at least a part of the first input terminal group are arranged along the first one of the long sides relatively closer to the display portion such that all of the output terminals are arranged along the first one of the long sides and the part of the first input terminal group are arranged apart from a rest of the first input terminal group and the second input terminal group, and the second input terminal group is arranged along the second one of the long sides.

2. The display driver circuit according to claim 1, wherein the first input terminal group arranged along the first one of the long sides includes parallel input terminals for receiving at least a part of the parallel data signals and the parallel clock signals.

3. The display driver circuit according to claim 2, wherein the parallel input terminals are arranged in the vicinity of the short side.

4. The display driver circuit according to claim 1, wherein the parallel input terminals included in the first input terminal group and intended to receive at least a part of the parallel data signals and the parallel clock signals are arranged along the short side.

5. The display driver circuit according to claim 1, wherein the second input terminal group arranged along the second one of the long sides includes input terminals for receiving the serial data signals and the serial clock signals.

6. A board module comprising:

a display driver circuit having a rectangular shape with long sides and short sides, the circuit configured to mount to a transparent substrate including a display portion for displaying images, the display portion located relatively closer to a first one of the long sides of the circuit than a second one of the long sides of the circuit, the display driver circuit including, a first input terminal group for receiving first signals based on a first interface specification, the first signals including parallel data signals and parallel clock signals based on a parallel interface specification, and the first input terminal group arranged along the first one of the long sides including parallel input terminals for receiving at least a part of the parallel data signals and the parallel clock signals, a second input terminal group for receiving second signals based on a second interface specification using signals which are lower in amplitude or higher in frequency than in the first interface specification such that each input terminal belongs to only one of the first input terminal group and the second input terminal group, the second signals including serial data signals and serial clock signals based on a serial interface specification, and an output terminal group for providing the display portion with display signals for displaying the images, the output terminal group including all output terminals of the display driver circuit, the display signals being generated based on at least one of the first and second signals;

a transparent substrate;

display lines formed on the transparent substrate and intended to transmit the display signals from the output terminal group to the display portion; and input lines formed on the transparent substrate and intended to transmit at least one of the first and second signals to be externally provided to at least one of the first and second input terminal groups, wherein, the output terminal group and at least a part of the first input terminal group are arranged along the first one of the long sides relatively closer to the display portion such that all of the output terminals are arranged along the first one of the long sides and the part of the first input terminal group are arranged apart from a rest of the first input terminal group and the second input terminal group, the second input terminal group is arranged along the second one of the long sides, and the display driver circuit is arranged such that the display portion is adjacent to the first one of the long sides along which the output terminal group and the part of the first input terminal group are arranged.

7. The board module according to claim 6, wherein, the display driver circuit is mounted on the transparent substrate as a circuit chip, the parallel input terminals are arranged in the vicinity of the short side, and input lines connected to the parallel input terminals are arranged so as to pass the short side from below the circuit chip.

8. The board module according to claim 6, wherein input lines connected to the parallel input terminals have a width greater than those of input lines connected to the second input terminal group arranged along the second one of the long sides.

* * * * *